United States Patent
Krasnov et al.

(10) Patent No.: US 9,567,666 B2
(45) Date of Patent: Feb. 14, 2017

(54) APPARATUS AND METHOD FOR MAKING SPUTTERED FILMS WITH REDUCED STRESS ASYMMETRY

(75) Inventors: Alexey Krasnov, Canton, MI (US); Willem den Boer, Brighton, MI (US); R. Glenn Stinson, Waxahachie, TX (US)

(73) Assignee: Guardian Industries Corp, Auburn Hills, MI (US)

(*) Notice: Subject to any disclaimer, the term of this patent is extended or adjusted under 35 U.S.C. 154(b) by 1366 days.

(21) Appl. No.: 12/318,919

(22) Filed: Jan. 12, 2009

(65) Prior Publication Data

US 2010/0175988 A1 Jul. 15, 2010

(51) Int. Cl.
- *C23C 14/35* (2006.01)
- *C23C 14/34* (2006.01)
- *C23C 14/54* (2006.01)
- *H01J 37/34* (2006.01)

(52) U.S. Cl.
CPC ........... *C23C 14/3407* (2013.01); *C23C 14/54* (2013.01); *H01J 37/3408* (2013.01); *H01J 37/3447* (2013.01)

(58) Field of Classification Search
USPC .................................................. 204/298.11
See application file for complete search history.

(56) References Cited

U.S. PATENT DOCUMENTS

| | | | |
|---|---|---|---|
| 3,985,635 A * | 10/1976 | Adam et al. | 204/298.11 |
| 5,262,032 A | 11/1993 | Hartig et al. | |
| 5,284,564 A | 2/1994 | Maass | |
| 5,317,006 A | 5/1994 | Kumar | |
| 5,344,352 A | 9/1994 | Horne et al. | |
| 5,403,458 A | 4/1995 | Hartig et al. | |
| 5,527,439 A | 6/1996 | Sieck et al. | |
| 5,591,314 A | 1/1997 | Morgan et al. | |

(Continued)

FOREIGN PATENT DOCUMENTS

| | | |
|---|---|---|
| DE | 694 20 902 T2 | 9/1999 |
| EP | 0 717 432 | 6/1996 |

(Continued)

OTHER PUBLICATIONS http://www.ssina.com/faq/index.html This website was posted multiple times going all the way back to Dec. 24, 2005. (see attached wayback machine track date for SSINA page.pdf).*

(Continued)

*Primary Examiner* — Jessee Roe
*Assistant Examiner* — Jenny Wu
(74) *Attorney, Agent, or Firm* — Nixon & Vanderhye P.C.

(57) ABSTRACT

Certain example embodiments of this invention relate to techniques for reducing stress asymmetry in sputtered polycrystalline films. In certain example embodiments, sputtering apparatuses that include one or more substantially vertical, non-conductive shield(s) are provided, with such shield(s) helping to reduce the oblique component of sputter material flux, thereby promoting the growth of more symmetrical crystallites. In certain example embodiments, the difference between the travel direction tensile stress and the cross-coater tensile stress of the sputtered film preferably is less than about 15%, more preferably less than about 10%, and still more preferably less than about 5%.

19 Claims, 6 Drawing Sheets

(56) References Cited

U.S. PATENT DOCUMENTS

| | | | |
|---|---|---|---|
| 5,605,576 A * | 2/1997 | Sasaki et al. | 118/723 E |
| 5,804,046 A * | 9/1998 | Sawada et al. | 204/298.11 |
| 5,922,176 A | 7/1999 | Caskey | |
| 6,287,436 B1 * | 9/2001 | Pelletier et al. | 204/298.11 |
| 6,583,544 B1 * | 6/2003 | Horsky et al. | 313/359.1 |
| 6,592,728 B1 * | 7/2003 | Paranjpe et al. | 204/298.11 |
| 2002/0023831 A1 * | 2/2002 | Iwase et al. | 204/192.12 |
| 2005/0199491 A1 * | 9/2005 | Gung et al. | 204/298.11 |
| 2006/0137970 A1 * | 6/2006 | Ahn | 204/192.15 |
| 2006/0188660 A1 * | 8/2006 | Teer | 427/524 |

FOREIGN PATENT DOCUMENTS

| | | |
|---|---|---|
| WO | WO 03/078677 | 9/2003 |
| WO | WO 2006/103134 | 10/2006 |

OTHER PUBLICATIONS

German Office Action dated May 29, 2015 for Application No. 10 2009 055 816.0-45.

\* cited by examiner

APPARATUS AND METHOD FOR MAKING SPUTTERED FILMS WITH REDUCED STRESS ASYMMETRY

FIELD OF THE INVENTION

Certain example embodiments of this invention relate to sputtering apparatuses. More particularly, certain example embodiments of this invention relate to techniques for reducing stress asymmetry in sputtered polycrystalline films. In certain example embodiments, sputtering apparatuses that include one or more substantially vertical, non-conductive shield(s) are provided, with such shield(s) helping to reduce the oblique component of sputter material flux, thereby promoting the growth of more symmetrical crystallites.

BACKGROUND AND SUMMARY OF EXAMPLE EMBODIMENTS OF THE INVENTION

The use of sputtering in order to deposit coatings on substrates is known in the art. For example, and without limitation, see U.S. Pat. Nos. 5,922,176; 5,403,458; 5,317,006; 5,527,439; 5,591,314; 5,262,032; and 5,284,564, the entire contents of each of which are hereby incorporated herein by reference. Briefly, sputter coating is a thin film coating process that involves the transport of almost any material from a target to a substrate of almost any other material. The ejection of the target material is accomplished by bombarding the surface of the target with gas ions accelerated by a high voltage. Particles are ejected from the target as a result of momentum transfer between the accelerated gas ions and the target. Upon ejection, the target particles traverse the sputtering chamber and are subsequently deposited on a substrate as a thin film.

Sputtering processes typically utilize an enclosed chamber confining a sputtering gas, a target electrically connected to a cathode, a substrate, and a chamber which itself may serve as the electrical anode. A power supply typically is connected such that the negative terminal of the power supply is connected to the cathode and the positive terminal is connected to the chamber walls. In operation, a sputtering gas plasma is formed and maintained within the chamber near the surface of the sputtering target. By electrically connecting the target to the cathode of the sputtering power supply and creating a negative surface charge on the target, electrons are emitted from the target. These electrons collide with atoms of the sputtering gas, thereby stripping away electrons from the gas molecules and creating positively charged ions. The resulting collection of positively charged ions together with electrons and neutral atoms is referred to generally as a sputtering gas plasma. The positively charged ions are accelerated toward the target material by the electrical potential between the sputtering gas plasma and the target and bombard the surface of the target material. As ions bombard the target, molecules of target material are ejected from the target surface and coat the substrate.

One known technique for enhancing conventional sputtering processes involves arranging magnets behind or near the target to influence the path taken by electrons within the sputtering chamber, thereby increasing the frequency of collisions with sputtering gas atoms or molecules. Additional collisions create additional ions, thus further sustaining the sputtering gas plasma. An apparatus utilizing this enhanced form of sputtering by means of strategically located magnets generally is referred to as a magnetron system.

Unfortunately, conventional sputtering techniques suffer from several disadvantages. For example, stress asymmetry in the travel and cross-coated directions of sputter-deposited polycrystalline films is a concern, especially in large-area applications that often require film patterning. Such applications include, for example, photovoltaic applications, flat-panel (e.g., plasma, LCD, etc.) display applications, etc. Some of the negative effects of stress asymmetry include, for example, layer delamination after laser scribing and subsequent heating in connection with photovoltaic devices, the formation of "mottling" defects in low-emissivity (low-E) products, layer peeling, etc. In certain coating applications, the inventors of the instant application observed stress asymmetry amount to a factor of three. In other words, the stress in the cross-coater direction was approximately three times as great as the stress in the travel direction, as measured, for example, in MPa.

One of the causes of stress asymmetry relates to the significant oblique component of the incoming material flux. The oblique component is subject to "shadowing effects," e.g., whereby crystalline tips (e.g., "higher points") receive more deposited material per unit time than valleys. Such shadowing effects tend to result in the formation of a granular structure including voids, which contributes to an increase in tensile stress in the direction of the higher oblique components, and/or a reduced amount of compressive stress, depending on the film. In this regard, FIG. 1 is an enlarged view of a sputter coated film produced using a conventional sputtering apparatus. FIG. 1 shows "normal" growth that tends to result in substantially columnar crystalline growth, as well as oblique growth that tends to result in voids.

It noted that the same or similar causes also contribute to "edge effects," e.g., where the thickness and sometimes even the physical properties of the coating are different from those of the rest of the coated area.

Thus, it will be appreciated that there is a need in the art for improved sputtering apparatuses and/or methods. It also will be appreciated that there is a need in the art for sputtering apparatuses and/or methods that reduce stress asymmetry in polycrystalline films.

One illustrative aspect of certain example embodiments relates to sputtering apparatuses that include one or more substantially vertical, non-conductive shield(s) are provided, with such shield(s) helping to reduce the oblique component of sputter material flux and also promoting the growth of more symmetrical crystallites.

In certain example embodiments of this invention, a magnetron sputtering apparatus for sputter coating an article in a reactive environment is provided. A vacuum chamber is provided. A sputtering target is located in the vacuum chamber, with the sputtering target having a target material located thereon. At least one shield is located proximate to the target such that a major axis of the each said shield runs parallel to a travel direction of the article to be sputter coated. Each said shield is electrical isolated and substantially non-magnetic. Each said shield is disposed in the vacuum chamber at a location suitable for reducing the oblique component of sputter material flux produced during the sputter coating of the article.

In certain example embodiments, a method of making a coated article is provided. A coating is sputtered onto the article via a magnetron sputtering apparatus comprising a vacuum chamber and a sputtering target located in the vacuum chamber, with the sputtering target having a target material located thereon, and with at least one shield located proximate to the target such that a major axis of the shield runs parallel to a travel direction of the article to be sputter coated. Each said shield is electrical isolated and substantially non-magnetic. Each said shield is disposed in the vacuum chamber at a location suitable for reducing the oblique component of sputter material flux produced during the sputter coating of the article such that the difference between the travel direction tensile stress and the cross-coater tensile stress of the coating on the article is less than about 15%.

In certain example embodiments, a magnetron sputtering apparatus for sputter coating an article in a reactive environment is provided. A vacuum chamber is provided. A sputtering target is located in the vacuum chamber, with the sputtering target having a target material located thereon. A cathode is connected to the planar sputtering target. One or more magnets are arranged to facilitate the sputter coating of the article. A plurality of shields is located proximate to, and spaced apart from, the target such that a major axis of each said shield runs parallel to a travel direction of the article to be sputter coated. Each said shield is electrical isolated and substantially non-magnetic. The length of each said shield is substantially the same as the dimension of the target that corresponds to the travel direction of the article to be sputter coated. Each said shield is disposed in the vacuum chamber at a location suitable for reducing the oblique component of sputter material flux produced during the sputter coating of the article.

The features, aspects, advantages, and example embodiments described herein may be combined to realize yet further embodiments.

BRIEF DESCRIPTION OF THE DRAWINGS

These and other features and advantages will be better and more completely understood by reference to the following detailed description of exemplary illustrative embodiments in conjunction with the drawings, of which.

DETAILED DESCRIPTION OF EXAMPLE EMBODIMENTS OF THE INVENTION

Certain example embodiments relate to techniques for reducing stress asymmetry in sputtered polycrystalline films. For example, the sputtering apparatus of certain example embodiments may include one or more substantially vertical, non-conductive shield(s) to help reduce the oblique component of sputter material flux, thereby promoting the growth of more symmetrical crystallites.

Figure 1:
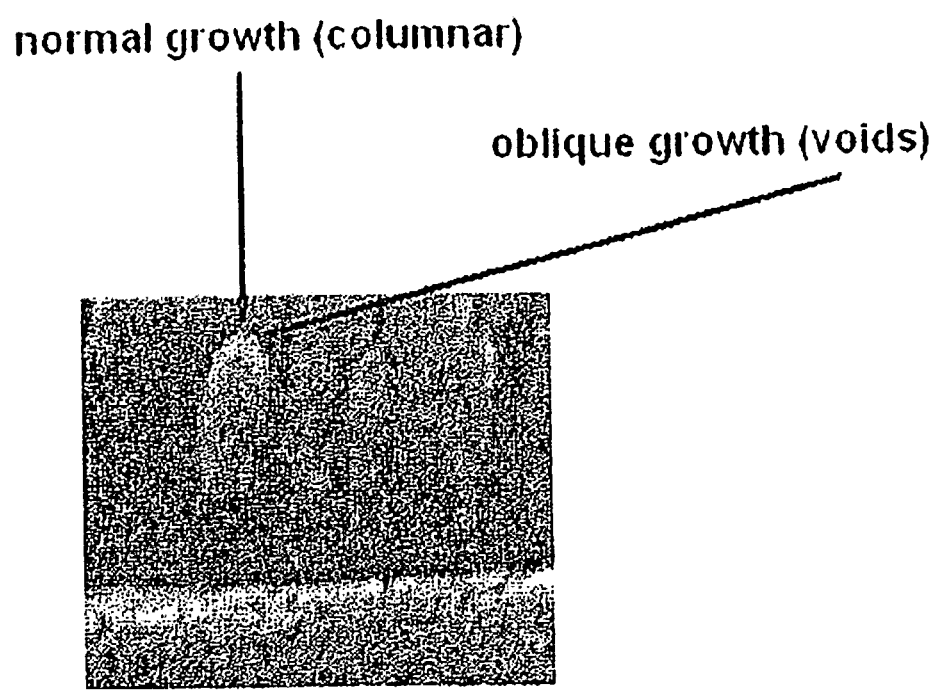
FIG. 1 is an enlarged view of a sputter coated film produced using a conventional sputtering apparatus.
Figure 2:
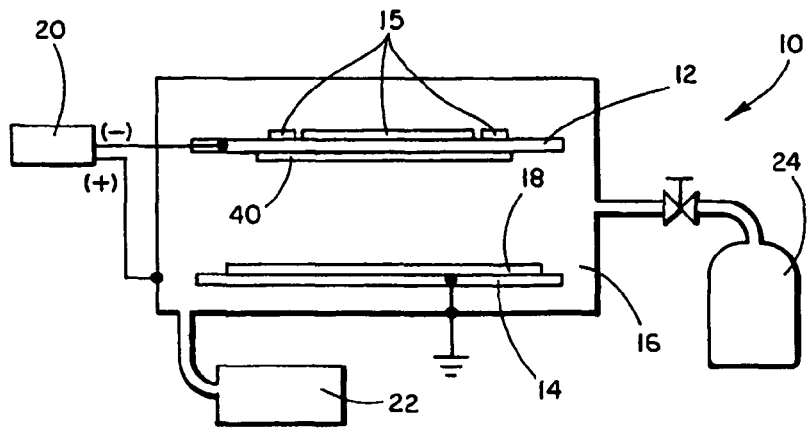
FIG. 2 is a simplified schematic illustration of a conventional reactive DC magnetron sputtering apparatus and target.
Figure 3:
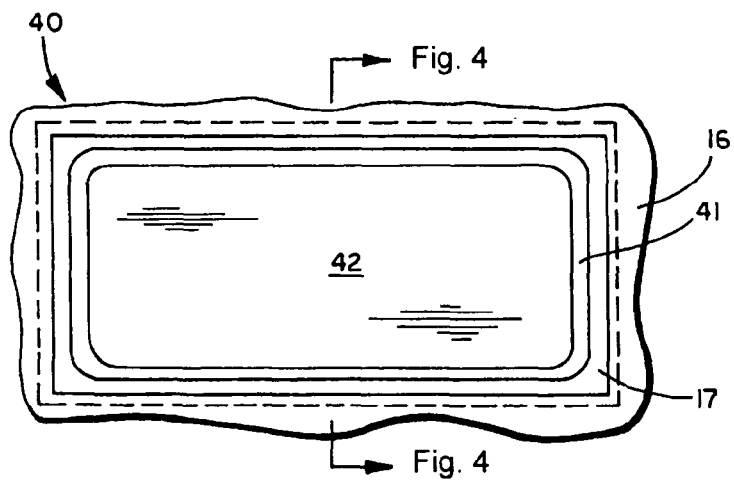
FIG. 3 is a top plan view of a conventional, planar sputtering target before sputtering.
Figure 4:
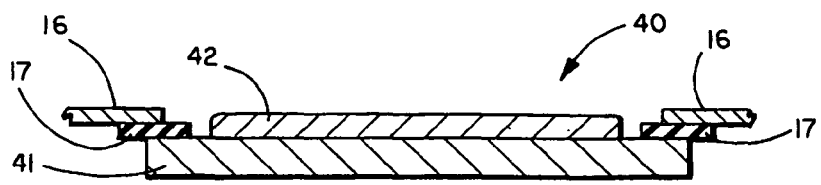
FIG. 4 is a cross section of the sputtering target of FIG. 3 before sputtering.

Referring now more particularly to the accompanying drawings in which like reference numerals indicate like parts throughout the several views, FIG. 2 is a simplified schematic illustration of a conventional reactive DC magnetron sputtering apparatus and target. Apparatus 10 typically includes a sputtering chamber 16, a vacuum means 22 to evacuate the chamber, a sputtering target such as a planar target 40 (as illustrated in FIGS. 3-4, for example), one or more magnets 15, a supply of sputtering gas 24, a power supply 20 having a positive terminal and a negative terminal, and means 14 to support and/or transport the substrate in the deposition region of the chamber. The target typically is electrically connected to cathode 12. Cathode 12 typically is electrically connected to the negative terminal of power supply 20. The sputtering chamber 16 itself sometimes is the electrical anode. Alternately, a separate anode element may be included inside the sputtering chamber and may be connected to its own power supply so as to be at some set potential other than ground with respect to cathode 12. Typically, the sputtering chamber 16 is at ground potential and, in some example instances, the sputtering chamber 16 may be connected to the positive terminal of the power supply. Usually, the target is at the most negative potential of any of the components of the sputtering apparatus (besides the negative terminal of the power supply). It will be appreciated that various electrical connections may be made between the power supply 20 and the various components of the sputtering apparatus 10.

Once the sputtering chamber 16 has been evacuated to the desired vacuum level by vacuum means 22, a sputtering gas 24 is introduced into chamber 16. In certain example sputtering processes, the sputtering gas 24 may be an inert gas such as argon, neon, etc. Other forms of sputtering processes known as reactive sputtering may use reactive non-inert gases such as oxygen or nitrogen. In addition, some sputtering operations may utilize a mixture of one or more inert gases and/or non-inert gases.

The sputtering target provides the material which is to be deposited onto the substrate. The size, shape, and construction of the target may vary depending upon the material and the size and shape of the substrate. A typical planar sputtering target 40 before sputtering is shown in FIG. 3-4. The planar sputtering target 40 comprises an electrically conducting backing plate 41 and a layer of electrically conducting target material 42 deposited thereon. An electrical insulator 17 may be employed to cover any exposed region of backing member 41 or other underlying surface. Typically, the chamber walls 16 will abut insulator 17 and extend up to, but not contact, the target material 42. Backing member 41 is not necessary for all target materials (e.g., such as those that are inherently rigid or of sufficient thickness). Thus, in such instances, the target material itself may also serve as the backing member.

Figure 5:
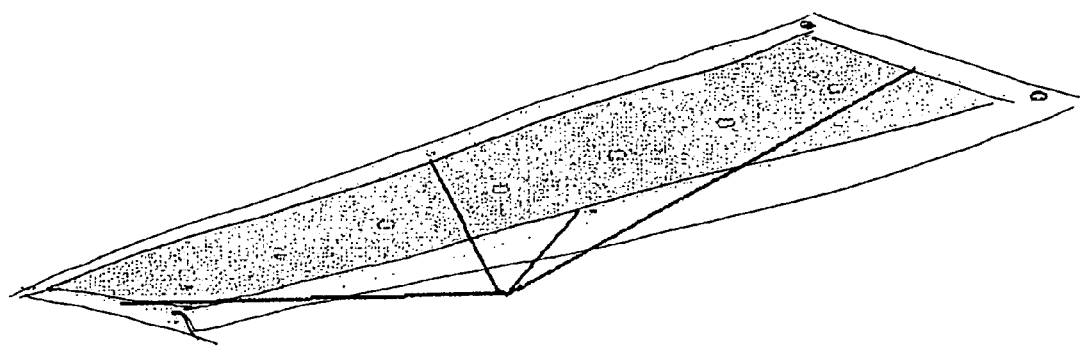
FIG. 5 shows the greater oblique component in the direction parallel to the longer axis of the target in the case of a substantially rectangular planar target having a large ratio of side dimensions.
Figure 6:
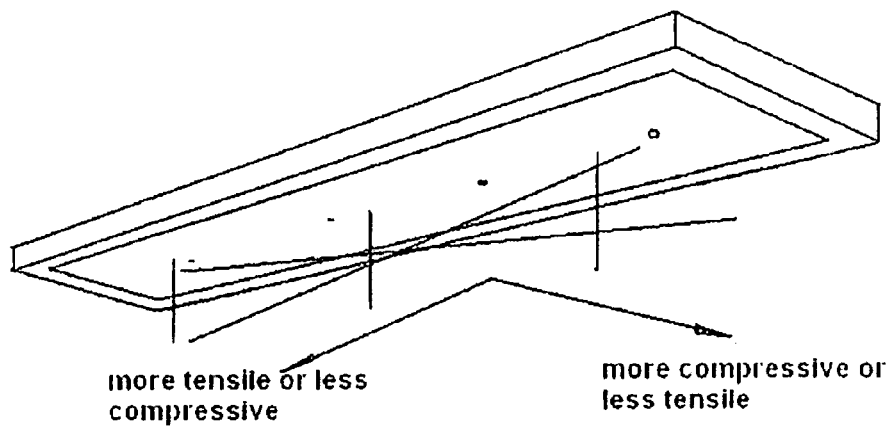
FIG. 6 shows the ratio of the oblique to the normal component being greater in the substrate travel direction in the case of a substantially rectangular planar target having a large ratio of side dimensions.

As noted above, one of the causes of stress asymmetry in sputtered films relates to the significant oblique component of the incoming material flux. FIGS. 5 and 6 show substantially rectangular planar targets, and the incoming material flux. An increase in process pressure reduces the mean free path of sputtering particles, especially those that are ionized. The portion of neutral particles, which are primarily scattered from the target to the substrate at small angles increases with increasing pressure. This phenomenon helps to explain the observed increase in stress asymmetry that accompanies increasing pressure. Along with gas flow variations, the oblique component is also at least partially responsible for edge effects which, as noted above, sometimes are observable in the coating. Thus, FIG. 5 shows the greater oblique component in the direction parallel to the longer axis of the target in the case of a substantially rectangular planar target having a large ratio of side dimensions, while FIG. 6 shows the ratio of the oblique to the normal component being greater in the substrate travel direction in the case of a substantially rectangular planar target having a large ratio of side dimensions. FIG. 6 also points out that there is more tensile stress or less compressive stress in the travel direction, whereas there is more compressive stress or less tensile stress in the direction perpendicular to the travel direction.

Accordingly, it will be appreciated that decreasing the oblique component and/or increasing the normal component of the incoming flux would result in better sputtered coatings. That is, in certain example embodiments, decreasing the oblique component and/or increasing the normal component of the incoming flux results in coatings having reduced stress asymmetries and/or reduces edge effects. In certain example embodiments, the stress asymmetry reduction will result in a pressure difference between the cross-coater and travel directions of less than a factor of 3, more preferably less than a factor of 2, and still more preferably will result in the stresses being about even in the cross-coater and travel directions.

Figures 7, 8:
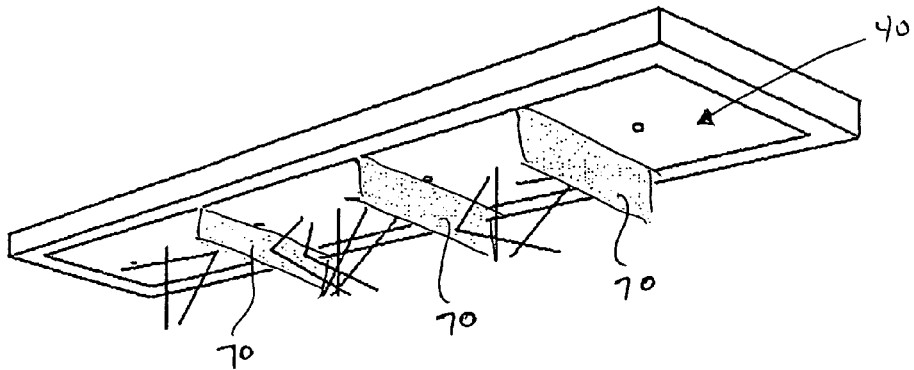
FIG. 7 is a substantially planar sputter target including a plurality of shields in accordance with an example embodiment.
FIG. 8 shows example arrangements of pre-measured stress silicon wafers used for testing certain example embodiments.

Certain example embodiments of this invention thus introduce one or more substantially vertical shield(s) adjacent to the cathode to block and/or re-direct the oblique component of the flux. FIG. 7 is a substantially planar sputter target 40 including a plurality of shields 70 in accordance with an example embodiment. The shields of certain example embodiments are made from a non-conductive material. When multiple shields are disposed within a single sputtering apparatus, they may be separated by a distance about equal to the length of the shortest side of the cathode. Where two or more shields are disposed within a single sputtering apparatus, they may be spaced apart at substantially equal intervals. Although the shield(s) may be adjacent to the cathode in certain example embodiments, they may be "floating," e.g., such that they are offset a predetermined distance from the cathodes and also may be electrically isolated from the cathode.

In a large coater, stress in the substrate cross-coater direction can be several times greater than that in the travel direction. For example, as noted above, the stress may be three times greater in the travel direction than in the cross-coater direction. However, by implementing the shields in connection with a large coater with the ratio of target sides being 17:5, certain example embodiments have resulted in a stress asymmetry reduction from about 20% to about 5%. In other words, certain example embodiments have been able to reduce stress asymmetry by a factor of about 4. In certain example embodiments, the stress asymmetry reduction will result in a pressure difference between the cross-coater and travel directions of less than a factor of 3, more preferably less than a factor of 2, and still more preferably will result in the stresses being about even in the cross-coater and travel directions. Differently stated, in certain example embodiments, the difference between the travel direction tensile stress and the cross-coater tensile stress preferably is less than about 15%, more preferably less than about 10%, and still more preferably less than about 5%.

In certain example embodiments, the shield may be electrically isolated from target and/or substantially non-magnetic. Thus, in certain example embodiments, the shields may be manufactured from an austenitic (substantially non-magnetic) 300 series stainless steel. The magnetic permeability (as measured by relative permeability or $\mu_r$) of 300 series stainless steel ranges from about 1.00-8.48, with an average magnetic permeability of about 1.27, as derived from 181 of the different grades of 300 series stainless steel. Accordingly, because 300 series stainless steel has low or substantially no magnetic permeability, it has little interference with the magnetic field generated during sputtering. More particularly, the shields of certain example embodiments may be a constructed from 304 series stainless steel. In certain example embodiments, the shields may be constructed from the material to be sputtered. In other words, if NiCr were to be sputtered, the shields also may be constructed from NiCr. This would help ensure that there would be no contamination via outside materials and/or would reduce the effect of any interaction between the sputtering process and the shields themselves. Of course, it will be appreciated that other materials may be used, with such materials preferably being electrically isolated from target and/or substantially non-magnetic.

The shields may, in certain example embodiments, be over-coated and, in this regard, also may exhibit flaking. To reduce or eliminate such problems, a bias may be introduced to the shield(s) in certain example embodiments. That is, in certain example embodiments, a negative bias may be introduced to the shields so as to reduce the amount of (and sometimes even completely prevent) debris from forming on the shields and eventually flaking off. The bias level may be "tuned" so as to reduce (and sometimes even completely avoid) any effects on the uniformity and/or other properties of the coating. The shield(s) may be biased with a DC or AC voltage in certain example embodiments. Also, the shield(s) may be sandblasted which, surprisingly and unexpectedly, helps to increase the deposition adhesion.

It will be appreciated the distance between shields may be varied and/or optimized. Additionally, it will be appreciated that the shield-to-substrate distance(s) also may be varied and/or optimized. Furthermore, it will be appreciated that tradeoffs may be made between the width of the windows between adjacent shields in example embodiments where multiple shields are implemented, and deposition rate.

EXAMPLE

A "grid" of shields was designed for testing purposes, and FIG. 8 shows example arrangements of pre-measured stress silicon wafers used for testing the stress asymmetry produced in connection with sputtering from a NiCr target in accordance with certain example embodiments. The grid shown in FIG. 8 includes three regions, each of which has three windows. The width of the windows in the first region is 6" (on the right-hand side of the grid), 4" in the second region (in the center of the grid), and 2" in the third region (on the left-hand side of the grid). The material used for the grid is 304 series stainless steel, and is 1/16" thick. As noted above, it will be appreciated that other materials could have been used for the grid. It also will be appreciated that the thickness of the grid may be varied, e.g., it may be made thinner or thicker.

The grid was first placed above the plasma shield of the sputtering apparatus so that the major axis of the grid corresponded to the major axis of the target. The grid interfered with the plasma, however, and resulted in unsuccessful coatings. Indeed, because the grid was at the same potential as the plasma shield, the maximum power dropped proportionally to the decrease in distance between the grid and the target compared to that between the shield and the target. Accordingly, the grid was repositioned to a location below the plasma shield, with about a 1.5" of clearance space therebetween. Thus, it will be appreciated that it is desirable in certain example embodiments position the shields below the plasma shield, offset at least a predetermined distance therefrom (e.g., 1.5", or more or less). Alternatively, certain example embodiments may adjust the potential of the shields with respect to the plasma shield to improve the coating properties.

With the grid so-positioned, silicon wafers along with glass slide coupons were positioned on the glass substrate to be sputter coated from the NiCr target according to the arrangements shown in FIG. 8. It will be appreciated that the right edge is the view-side edge of the target, and the origin is aligned with the wide-space edge of the grid. The layout for each run is presented in FIG. 8. Additionally, FIG. 8 shows that high and low power modes (e.g., 25 kW and 50 kW modes, respectively) were used. Kapton tape was placed on each slide for thickness measurement.

Figure 9:
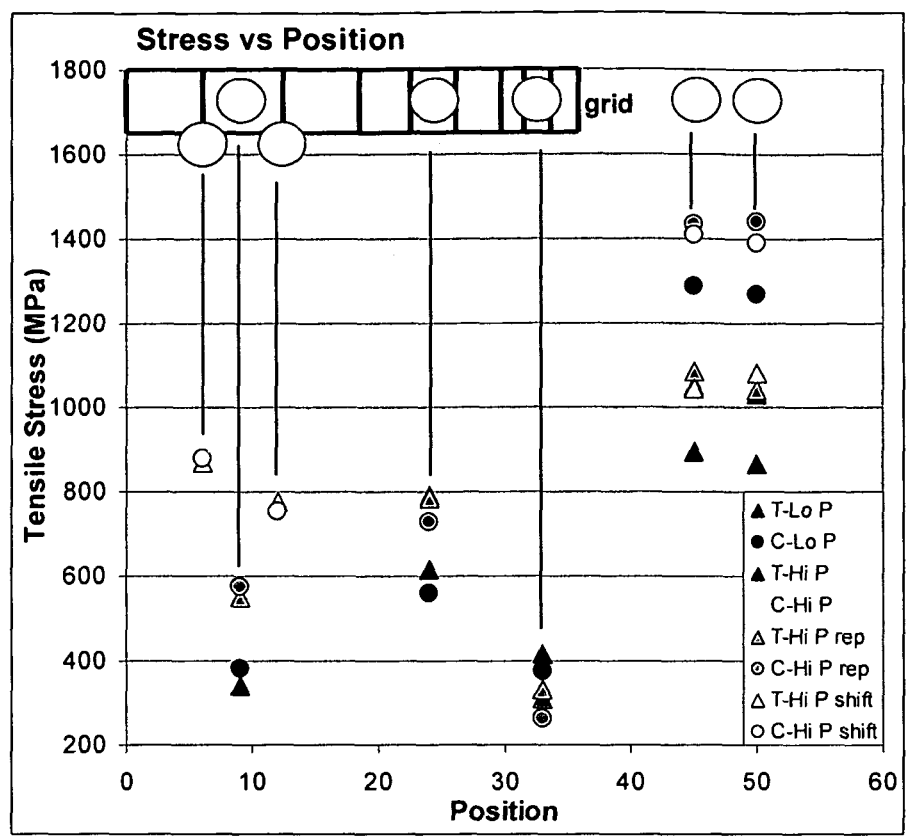
FIG. 9 is a tensile stress vs. position graph corresponding to the tests performed with reference to FIG. 8.
Figure 10:
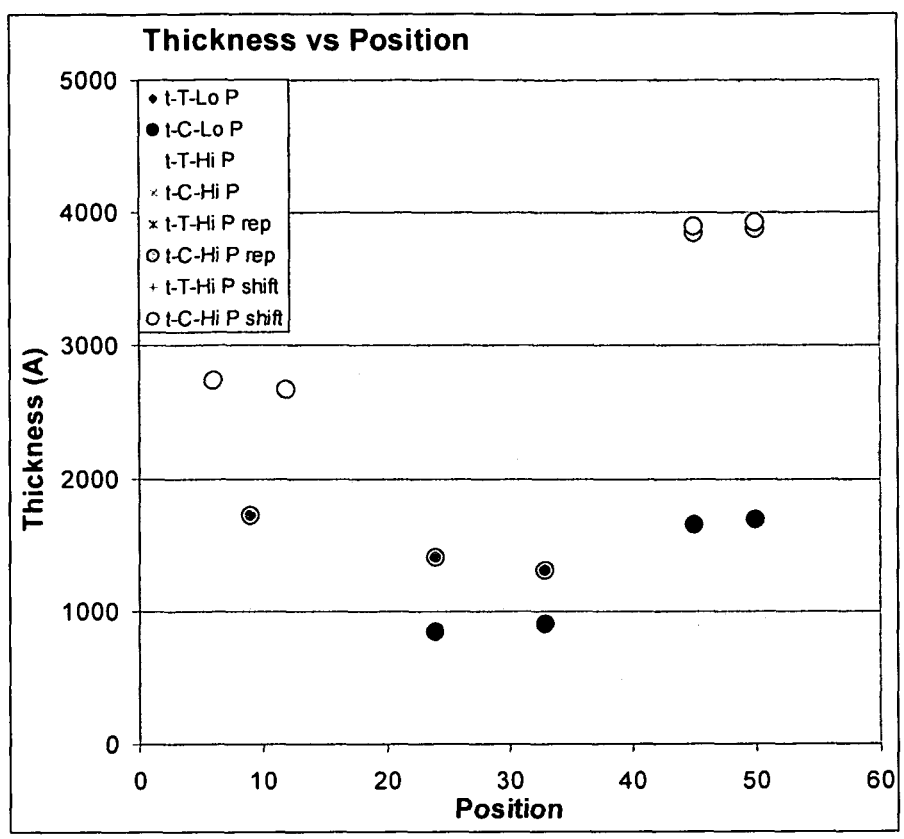
FIG. 10 is a thickness vs. position graph corresponding to the tests performed with reference to FIG. 8.

The results of the experiments described in FIG. 8 are shown in FIGS. 9 and 10. More particularly, FIG. 9 is a tensile stress vs. position graph corresponding to the tests performed with reference to FIG. 8, FIG. 10 is a thickness vs. position graph corresponding to the tests performed with reference to FIG. 8. In FIGS. 9 and 10, the tensile stress and thickness respectively are shown for travel and cross-coater directions at high and low power modes are shown. Advantageously, little to no flaking or extra deposits due to the grid were observed.

About 40% of asymmetry in tensile stress was observed in the NiCr coatings with thicknesses ranging from 2000-4000 Å. The cross-coater tensile stress was higher than that in travel direction. Placing a collimating grid below the shield was found to result in a dramatic decrease of stress asymmetry to less than about 5%. In other words, the difference between the travel direction tensile stress and the cross-coater tensile stress was less than about 5%. Surprisingly and unexpectedly, the stress ratio flipped in the regions with narrower windows, likely as a result of the opening in travel direction (6") being greater than the width of the window (4" or 2"). Little or no debris issues were observed after these several runs of the experiment.

It will be appreciated that the stress asymmetry problems related to sputtering described herein may apply to materials other than those described herein (e.g., materials other than Mo and NiCr). Correspondingly, it will be appreciated that the techniques described herein can be applied to such alternative materials. Also, although certain example embodiments have been described in connection with substantially rectangular planar sputtering targets, it will be appreciated that the example embodiments described herein may be applied to otherwise shaped planar sputtering targets, as well as cylindrical sputtering targets.

While a particular layer or coating may be said to be "on" or "supported by" a surface or another coating (directly or indirectly), other layer(s) and/or coatings may be provided therebetween. Thus, for example, a coating may be considered "on" and "supported by" a surface even if other layer(s) are provided between layer(s) and the substrate. Moreover, certain layers or coatings may be removed in certain embodiments, while others may be added in other embodiments without departing from the overall spirit of certain embodiments of this invention. Thus, by way of example, an encapsulating coating applied in liquid sol-gel form in accordance with an example embodiment may be said to be "on" or "supported by" a sputtering target material, even though other coatings and/or layers may be provided between the sol-gel formed coating and the target material.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A sputtering apparatus for sputter coating an article in a reactive environment, comprising:
   a vacuum chamber;
   a sputtering target located in the vacuum chamber, the sputtering target including a target material and to be located over the article to be sputter coated; and
   a plurality of substantially parallel shields located proximate to the target such that major axes of the respective shields are substantially parallel to each other and extend parallel to a travel direction of the article to be sputter coated in the sputtering apparatus, so that substantially parallel shields are only oriented parallel to the travel direction in the vacuum chamber and there are no shields in the vacuum chamber that are oriented in any other direction;
   each said shield being electrically isolated and substantially non-magnetic, and wherein each said shield extends from the target perpendicularly toward a horizontal surface of the article to be sputter coated which is located below the target and below the shields and which is travelling in the travel direction in the sputtering apparatus, and wherein each said shield has a vertical depth that is substantially less than a distance between the target and the horizontal surface and each said shield does not extend below the horizontal surface of the article to be sputter coated; and
   wherein each said shield is disposed in the vacuum chamber at a location suitable for reducing the oblique component of sputter material flux produced during the sputter coating of the article compared to an apparatus that lacked the shields such that a difference between the travel direction tensile stress and the cross-coater tensile stress of the coating on the article is less than about 15%.

2. The sputtering apparatus of claim 1, wherein the sputtering target is substantially planar.

3. The sputtering apparatus of claim 1, wherein the length of each said shield is substantially the same as the dimension of the target that corresponds to the travel direction of the article to be sputter coated.

4. The sputtering apparatus of claim 1, wherein each said shield is formed from stainless steel.

5. The sputtering apparatus of claim 4, wherein each said shield is formed from 300 series stainless steel.

6. The sputtering apparatus of claim 1, wherein each said shield is negatively biased.

7. The sputtering apparatus of claim 1, wherein each said shield is spaced apart from the target.

8. The sputtering apparatus of claim 1, wherein said plurality of shields are provided in a grid that includes the plurality of shields.

9. The apparatus of claim 1, wherein the target includes a cathode.

10. The apparatus of claim 1, wherein each said shield is disposed in the vacuum chamber at a location suitable for reducing the oblique component of sputter material flux produced during the sputter coating of the article such that the difference between the travel direction tensile stress and the cross-coater tensile stress of the coating on the article is less than about 10%.

11. A method of making a coated article, the method comprising:

sputtering a coating onto an article to be sputter coated in a vacuum chamber, a sputtering target being located in the vacuum chamber, the sputtering target comprising a target material, providing a plurality of substantially parallel shields proximate to the target such that major axes of the respective shields are substantially parallel to each other and extend parallel to a travel direction of the article to be sputter coated in the sputtering apparatus, and during said sputtering causing the article to be sputter coated to pass below the target and below the shields while travelling in the travel direction, and wherein substantially parallel shields are only oriented parallel to the travel direction in the vacuum chamber and there are no shields in the vacuum chamber that are oriented in any other direction; wherein each said shield has a vertical depth that is substantially less than a distance between the target and a horizontal surface of the article to be sputter coated and each said shield does not extend below said horizontal surface of the article to be sputter coated;

each said shield being electrically isolated from the sputtering target and substantially non-magnetic, wherein each said shield is disposed in the vacuum chamber at a location suitable for reducing the oblique component of sputter material flux produced during the sputter coating of the article such that the difference between the travel direction tensile stress and the cross-coater tensile stress of the coating on the article is less than about 15%.

12. The method of claim 11, wherein the sputtering target is substantially planar.

13. The method of claim 11, wherein the length of each said shield is substantially the same as the dimension of the target that corresponds to the travel direction of the article to be sputter coated.

14. The method of claim 13, further comprising negatively biasing each said shield.

15. The method of claim 11, wherein each said shield is spaced apart from the target.

16. The method of claim 11, wherein the difference between the travel direction tensile stress and the cross-coater tensile stress of the coating on the article is less than about 10%.

17. The method of claim 11, wherein the difference between the travel direction tensile stress and the cross-coater tensile stress of the coating on the article is less than about 5%.

18. A sputtering apparatus for sputter coating an article, comprising:

a vacuum chamber;

a sputtering target located in the vacuum chamber, the sputtering target comprising a target material and a cathode;

one or more magnets arranged to facilitate the sputter coating of the article; and a plurality of shields located proximate to, and spaced apart from, the target such that the plurality of shields extend substantially parallel to each other and major axes of said respective shields run substantially parallel to a travel direction of the article to be sputter coated, each said shield being substantially non-magnetic, and the shields being interposed between the target and the article to be sputter coated, wherein substantially parallel shields are only oriented parallel to the travel direction in the vacuum chamber and there are no shields in the vacuum chamber that are oriented in any other direction;

wherein each said shield has a vertical depth that is substantially less than a distance between the target and a horizontal surface of the article to be sputter coated and each said shield does not extend below said horizontal surface of the article to be sputter coated;

wherein the length of each said shield is substantially the same as the dimension of the target that corresponds to the travel direction of the article to be sputter coated, and wherein each said shield is disposed in the vacuum chamber at a location suitable for reducing the oblique component of sputter material flux produced during the sputter coating of the article compared to an apparatus that lacked the plurality of shields.

19. The apparatus of claim 18, wherein each said shield is disposed in the vacuum chamber at a location suitable for reducing the oblique component of sputter material flux produced during the sputter coating of the article such that the difference between the travel direction tensile stress and the cross-coater tensile stress of the coating on the article is less than about 5%.

* * * * *